(12) United States Patent
Kishi et al.

(10) Patent No.: US 11,539,343 B2
(45) Date of Patent: Dec. 27, 2022

(54) ACOUSTIC WAVE DEVICE, HIGH-FREQUENCY FRONT-END CIRCUIT, AND COMMUNICATION DEVICE

(71) Applicant: Murata Manufacturing Co., Ltd., Nagaokakyo (JP)

(72) Inventors: Yuzo Kishi, Nagaokakyo (JP); Yutaka Kishimoto, Nagaokakyo (JP); Makoto Sawamura, Nagaokakyo (JP); Seiji Kai, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 350 days.

(21) Appl. No.: 16/906,096

(22) Filed: Jun. 19, 2020

(65) Prior Publication Data
US 2020/0321937 A1 Oct. 8, 2020

Related U.S. Application Data (63) Continuation of application No. PCT/JP2018/045215, filed on Dec. 10, 2018.

(30) Foreign Application Priority Data

Dec. 22, 2017 (JP) .............................. JP2017-245673

(51) Int. Cl.
*H03H 9/02* (2006.01)
*H03F 3/21* (2006.01)
(Continued)

(52) U.S. Cl.
CPC ........... *H03H 9/02897* (2013.01); *H03F 3/21* (2013.01); *H03H 9/02866* (2013.01);
(Continued)

(58) Field of Classification Search
CPC ........... H03H 9/02897; H03H 9/02866; H03H 9/059; H03H 9/1092; H03H 9/145;
(Continued)

(56) References Cited

U.S. PATENT DOCUMENTS

2004/0145278 A1 7/2004 Iwamoto
2007/0169324 A1 7/2007 Yajima et al.
(Continued)

FOREIGN PATENT DOCUMENTS

JP 2004-248243 A 9/2004
JP 2005-295363 A 10/2005
(Continued)

OTHER PUBLICATIONS

Official Communication issued in International Patent Application No. PCT/JP2018/045215, dated Feb. 5, 2019.

*Primary Examiner* — Eugene Yun
(74) *Attorney, Agent, or Firm* — Keating & Bennett, LLP (57) ABSTRACT

An acoustic wave device includes a silicon support substrate that includes first and second main surfaces opposing each other, a piezoelectric structure provided on the first main surface and including the piezoelectric layer, an IDT electrode provided on the piezoelectric layer, a support layer provided on the first main surface of the silicon support substrate and surrounding the piezoelectric layer, a cover layer provided on the support layer, a through-via electrode that extending through the silicon support substrate and the piezoelectric structure, and a first wiring electrode connected to the through-via electrode and electrically connected to the IDT electrode. The piezoelectric structure includes at least one layer having an insulating property, the at least one layer including the piezoelectric layer. The first wiring electrode is provided on the layer having an insulating property in the piezoelectric structure.

14 Claims, 4 Drawing Sheets

(51) Int. Cl.
*H03H 9/05* (2006.01)
*H03H 9/10* (2006.01)
*H03H 9/145* (2006.01)
*H03H 9/25* (2006.01)
*H04B 1/40* (2015.01)

(52) U.S. Cl.
CPC .......... *H03H 9/059* (2013.01); *H03H 9/1092* (2013.01); *H03H 9/145* (2013.01); *H03H 9/25* (2013.01); *H04B 1/40* (2013.01); *H03F 2200/451* (2013.01)

(58) Field of Classification Search
CPC .. H03H 9/25; H03H 9/02574; H03H 9/02992; H03H 9/1071; H03F 3/21; H03F 2200/451; H03F 2200/294; H03F 3/195; H03F 3/245; H03F 3/72; H03F 2203/7209; H04B 1/40
See application file for complete search history.

(56) References Cited

U.S. PATENT DOCUMENTS

| | | | |
|---|---|---|---|
| 2009/0114441 A1* | 5/2009 | Hashimoto | H03H 9/1021 174/521 |
| 2015/0123744 A1 | 5/2015 | Nishimura et al. | |
| 2016/0294354 A1 | 10/2016 | Saijo et al. | |
| 2016/0380611 A1 | 12/2016 | Kai | |
| 2017/0250669 A1* | 8/2017 | Kuroyanagi | H03H 9/0547 |
| 2018/0091116 A1 | 3/2018 | Kai | |
| 2018/0138893 A1* | 5/2018 | Caron | H04L 25/00 |
| 2019/0058453 A1 | 2/2019 | Sekiya et al. | |
| 2019/0068155 A1 | 2/2019 | Kimura et al. | |
| 2019/0123709 A1* | 4/2019 | Inoue | H03H 9/0222 |
| 2019/0393854 A1 | 12/2019 | Koyanagi et al. | |
| 2020/0014368 A1* | 1/2020 | Schiek | H03H 9/6469 |

FOREIGN PATENT DOCUMENTS

| | | |
|---|---|---|
| JP | 2006-067271 A | 3/2006 |
| JP | 2007-194999 A | 8/2007 |
| JP | 2009-117544 A | 5/2009 |
| JP | 2015-091065 A | 5/2015 |
| JP | 2017-011681 A | 1/2017 |
| JP | 2017-157922 A | 9/2017 |
| JP | 2018-101913 A | 6/2018 |
| WO | 2015/098679 A1 | 7/2015 |
| WO | 2016/208427 A1 | 12/2016 |
| WO | 2017/212742 A1 | 12/2017 |
| WO | 2017/212774 A1 | 12/2017 |
| WO | 2018/164209 A1 | 9/2018 |

* cited by examiner

ACOUSTIC WAVE DEVICE, HIGH-FREQUENCY FRONT-END CIRCUIT, AND COMMUNICATION DEVICE

CROSS REFERENCE TO RELATED APPLICATIONS

This application claims the benefit of priority to Japanese Patent Application No. 2017-245673 filed on Dec. 22, 2017 and is a Continuation Application of PCT Application No. PCT/JP2018/045215 filed on Dec. 10, 2018. The entire contents of each application are hereby incorporated herein by reference.

BACKGROUND OF THE INVENTION

1. Field of the Invention

The present invention relates to an acoustic wave device, a high-frequency front-end circuit, and a communication device.

2. Description of the Related Art

In the related art, acoustic wave devices have been widely used as, for example, filters of cellular phones. Japanese Unexamined Patent Application Publication No. 2005-295363, which will be described below, discloses an example of a surface acoustic wave device that has a wafer level package (WLP) structure. In this surface acoustic wave device, a piezoelectric thin film is provided on a silicon substrate, and a comb-shaped electrode is provided on the piezoelectric thin film. A protective film that has a wall portion surrounding the comb-shaped electrodes is provided on the piezoelectric thin film. A resin film is provided on the protective film to seal a cavity that is defined by the wall portion of the protective film.

International Publication No. 2016/208427 also discloses an example of an acoustic wave device that has a WLP structure. In this acoustic wave device, a wiring electrode that is electrically connected to an interdigital transducer (IDT) electrode is extended to a support substrate.

In Japanese Unexamined Patent Application Publication No. 2005-295363, a support layer that serves as the protective film and that supports a cover layer serving as the resin film is provided on a piezoelectric layer serving as the piezoelectric thin film, and thus, a large external force may sometimes act on the piezoelectric layer during, for example, the manufacturing process. Consequently, a fracture may occur in the piezoelectric layer, which in turn results in breakage of the piezoelectric layer.

In contrast, in the acoustic wave device of International Publication No. 2016/208427, a wiring electrode is extended to the support substrate, and thus, in the case where the support substrate is a silicon support substrate having electrical conductivity, a leakage current is likely to be generated. Thus, filter characteristics of the acoustic wave device, for example, insertion loss, may deteriorate.

SUMMARY OF THE INVENTION

Preferred embodiments of the present invention provide acoustic wave devices, high-frequency front-end circuits, and communication devices in each of which a piezoelectric layer does not break easily and in each of which filter characteristics are less likely to deteriorate.

An acoustic wave device according to a preferred embodiment of the present invention includes a silicon support substrate that includes a first main surface and a second main surface opposing each other, a piezoelectric structure that is provided on the first main surface of the silicon support substrate and that includes a piezoelectric layer, an IDT electrode that is provided on the piezoelectric layer, a support layer that is provided on the first main surface of the silicon support substrate and surrounds the piezoelectric layer, a cover layer that is provided on the support layer, a through-via electrode that extends through the silicon support substrate and the piezoelectric structure, and a first wiring electrode that is connected to the through-via electrode and electrically connected to the IDT electrode. The piezoelectric structure includes at least one layer having an insulating property, the at least one layer including the piezoelectric layer. The first wiring electrode is provided on the layer having an insulating property.

A high-frequency front-end circuit according to a preferred embodiment of the present invention includes an acoustic wave device according to a preferred embodiment of the present invention and a power amplifier.

A communication device according to a preferred embodiment of the present invention includes a high-frequency front-end circuit according to a preferred embodiment of the present invention and an RF signal processing circuit.

According to preferred embodiments of the present invention, acoustic wave devices, high-frequency front-end circuits, and communication devices in each of which a piezoelectric layer does not break easily and in each of which filter characteristics are less likely to deteriorate are able to be provided.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Preferred embodiments of the present invention will be described below with reference to the drawings to clarify the present invention.

The preferred embodiments described in the present specification are examples, and it is to be noted that the features components, and elements according to the different preferred embodiments may be partially replaced or combined with one another.

Figure 1:
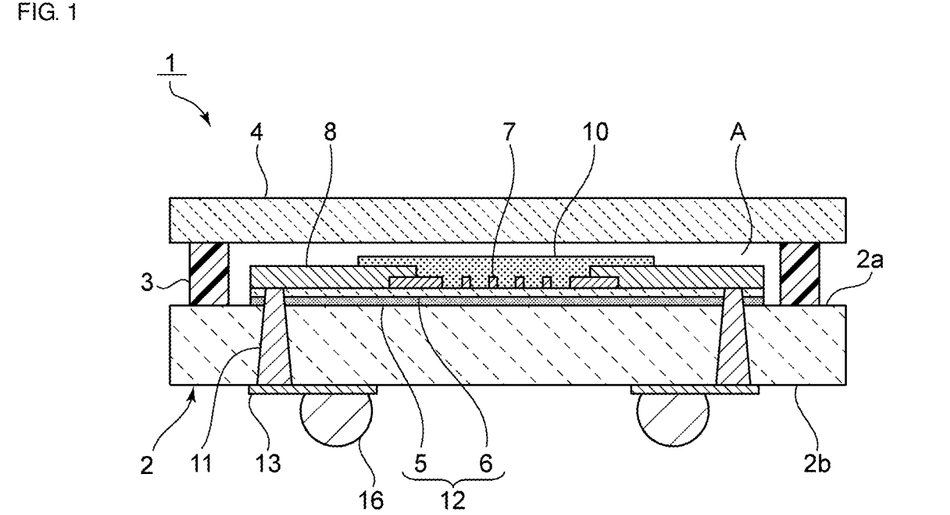
FIG. 1 is a sectional front view of an acoustic wave device according to a first preferred embodiment of the present invention.

FIG. 1 is a sectional front view of an acoustic wave device according to a first preferred embodiment of the present invention.

An acoustic wave device 1 includes a silicon support substrate 2. The silicon support substrate 2 includes a first main surface 2a and a second main surface 2b opposing each other. A support layer 3 that is made of a resin is provided on the first main surface 2a of the silicon support substrate 2. The support layer 3 has a frame shape. A cover layer 4 is provided on the support layer 3 and seals an upper opening of the support layer 3. Although the material of cover layer 4 is not particularly limited, the cover layer 4 is preferably made of, for example, silicon (Si) in the first preferred embodiment. The cover layer 4 may be made of a suitable resin.

A space A is defined by the silicon support substrate 2, the support layer 3, and the cover layer 4.

In the space A, a low-acoustic-velocity film 5 is laminated on the silicon support substrate 2. A piezoelectric layer 6 is laminated on the low-acoustic-velocity film 5. The low-acoustic-velocity film 5 and the piezoelectric layer 6 define a piezoelectric structure 12. An IDT electrode 7 is provided on the piezoelectric layer 6 of the piezoelectric structure 12.

A first wiring electrode 8 is electrically connected to the IDT electrode 7.

A dielectric film 10 covers the IDT electrode 7. The dielectric film 10 is not necessarily provided.

Here, a through-via electrode 11 extends through the silicon support substrate 2, the low-acoustic-velocity film 5, and the piezoelectric layer 6. An upper end of the through-via electrode 11 is connected to the first wiring electrode 8. A lower end of the through-via electrode 11 is located at the second main surface 2b of the silicon support substrate 2. A second wiring electrode 13 is provided on the second main surface 2b. The second wiring electrode 13 is connected to the lower end of the through-via electrode 11. The upper end and the lower end respectively refer to an upper end portion and a lower end portion in FIG. 1. The first wiring electrode 8 and the second wiring electrode 13 may each include an electrode land that is wider than the other portions of the wiring electrode. The two ends of the through-via electrode 11 may be connected to the electrode lands of the first wiring electrode 8 and the second wiring electrode 13.

A bump 16 is provided on the second wiring electrode 13. The IDT electrode 7 is electrically connected to the outside via the first wiring electrode 8, the through-via electrode 11, the second wiring electrode 13, and the bump 16.

The acoustic wave device 1 of the first preferred embodiment includes the silicon support substrate 2, the piezoelectric structure 12 that is provided on the first main surface 2a of the silicon support substrate 2 and that includes the piezoelectric layer 6 and the low-acoustic-velocity film 5, the IDT electrode 7 that is provided on the piezoelectric layer 6, the support layer 3 that is provided on the first main surface 2a of the silicon support substrate 2 and surrounds the piezoelectric layer 6, the cover layer 4 that is provided on the support layer 3, the through-via electrode 11 that extends through the silicon support substrate 2 and the piezoelectric structure 12, and the first wiring electrode 8 that is provided on the piezoelectric structure 12, connected to the through-via electrode 11, and electrically connected to the IDT electrode 7. In the acoustic wave device 1, the first wiring electrode 8 is provided on the piezoelectric layer 6 that is included in the piezoelectric structure 12 and that has an insulating property. As a result, a leakage current is less likely to be generated between the first wiring electrode 8 and the silicon support substrate 2. Thus, filter characteristics of the acoustic wave device 1 are less likely to deteriorate. In addition, an external force is less likely to act on the piezoelectric layer 6. Therefore, the piezoelectric layer 6 does not break easily.

In the acoustic wave device 1, since the IDT electrode 7 is provided on the piezoelectric layer 6, an acoustic wave is excited by applying an alternating-current electric field to the IDT electrode 7.

The low-acoustic-velocity film 5 is made of a low acoustic velocity material, and the acoustic velocity of a bulk wave that propagates through the low-acoustic-velocity film 5 is lower than the acoustic velocity of a bulk wave that propagates through the piezoelectric layer 6. An inorganic insulating material, a resin material, or the like, for example, may be used as a low acoustic velocity material. More specifically, for example, the low-acoustic-velocity film 5 is preferably made of glass, silicon oxynitride, tantalum oxide, or a material that includes, as a main component, a compound provided by adding fluorine, carbon, or boron to a silicon oxide. The material of the low-acoustic-velocity film 5 has a relatively low acoustic velocity. In the first preferred embodiment, the low-acoustic-velocity film 5 is one of the layers that are included in the piezoelectric structure 12 and each of which has an insulating property.

The acoustic velocity of a bulk wave that propagates through the silicon support substrate 2 is higher than the acoustic velocity of an acoustic wave that propagates through the piezoelectric layer 6. Thus, the acoustic wave device 1 has a structure in which the silicon support substrate 2, which defines and functions as a high-acoustic-velocity support substrate, the low-acoustic-velocity film 5, and the piezoelectric layer 6 are laminated together, and thus, energy of an excited acoustic wave is able to be effectively confined to the side of the piezoelectric layer 6. In the case where the acoustic wave device 1 includes a multilayer structure, the thickness of the piezoelectric layer 6 is normally considerably smaller than the thickness of a piezoelectric single-crystal substrate included in an acoustic wave device that includes a piezoelectric single crystal substrate. When the wavelength that is defined by the pitch of the electrode fingers of the IDT electrode 7 is λ, the thickness of the piezoelectric layer 6 is preferably about 3.5λ or less, for example, to increase the Q value.

In the case where the piezoelectric layer 6 has a small thickness as described above, the piezoelectric layer 6 may break easily. However, in the acoustic wave device 1 of the first preferred embodiment, since the piezoelectric layer 6 is provided in the space A, when the support layer 3 or the cover layer 4 is provided in the manufacturing process, stress is less likely to be applied to the piezoelectric layer 6. Even when the acoustic wave device 1 is provided, stress is less likely to be applied to the piezoelectric layer 6. Thus, breakage of the piezoelectric layer 6 is able to be significantly reduced or prevented.

Although the support layer 3 is made of a synthetic resin, for example, a polyimide, the support layer 3 may be made of an insulating material other than a synthetic resin, which is, for example, an inorganic insulating material. The support layer 3 is preferably made of, for example, a resin. Accordingly, the manufacturing costs of the support layer 3 may be reduced, and simplification of the manufacturing process may be provided.

The dielectric film 10 covers the IDT electrode 7. Thus, frequency adjustment is able to be performed by adjusting the thickness or the material of the dielectric film 10. In addition, as a result of providing the dielectric film 10, the IDT electrode 7 is able to be protected from the surroundings.

Although the material of the dielectric film 10 is not particularly limited, an inorganic dielectric material, for example, a silicon oxide or silicon oxynitride may be used.

The space A is preferably sealed, for example, to reduce the probability that variations in the characteristics of the acoustic wave device 1 will occur.

As shown in FIG. 1, when viewed in a direction normal or substantially normal to the second main surface 2b of the silicon support substrate 2, the through-via electrode 11 is preferably positioned in a region surrounded by the support layer 3, for example. As a result, stress is less likely to be applied to the through-via electrode 11 in, for example, the manufacturing process. Thus, the through-via electrode 11 does not break easily.

In the acoustic wave device 1, the low-acoustic-velocity film 5 is located in the region surrounded by the support layer 3. However, the low-acoustic-velocity film 5 may be extended to the lower surface of the support layer 3 and to the outside of the support layer 3. Accordingly, the support layer 3 is indirectly laminated on the first main surface 2a of the silicon support substrate 2. However, the support layer 3 is preferably, for example, directly laminated on the first main surface 2a as shown in FIG. 1, to thus simplify the process.

In addition, although the support layer 3 has a frame shape, the shape of the support layer 3 is not limited to a frame shape as long as the support layer 3 is able to surround the functional component or element, which includes the piezoelectric layer 6 and the IDT electrode 7. Thus, the space A is not limited to being a sealed space.

The IDT electrode 7, the first wiring electrode 8, the through-via electrode 11, and the second wiring electrode 13 are each made of a suitable metal or a suitable alloy, for example, and their materials are not particularly limited.

The electrode structure of a functional electrode that includes the IDT electrode 7 is also not particularly limited, and the electrode structure including the IDT electrode 7 may be modified to provide various functional components or elements, for example, an acoustic wave resonator and an acoustic wave filter.

When viewed in the direction normal or substantially normal to the second main surface 2b of the silicon support substrate 2, the bump 16 is preferably provided, for example, at a position that does not overlap the through-via electrode 11. As a result, when the bump 16 is provided in the manufacturing process, stress is less likely to be applied to the through-via electrode and the piezoelectric layer 6. Therefore, the through-via electrode 11 and the piezoelectric layer 6 do not break easily.

When viewed in the direction normal or substantially normal to the second main surface 2b of the silicon support substrate 2, the bump 16 is preferably positioned, for example, farther toward the inner side than the through-via electrode 11. Accordingly, a reduction in the size of the acoustic wave device 1 is able to be provided.

Figure 2:
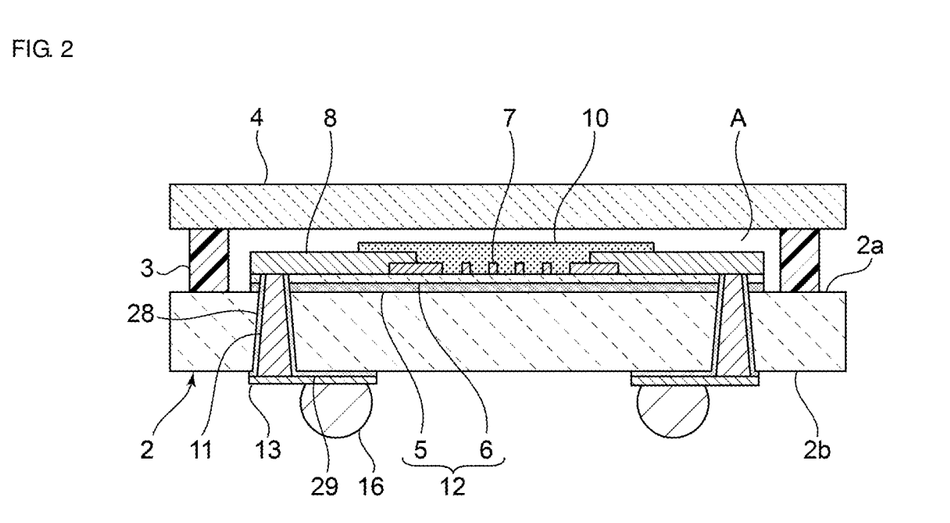
FIG. 2 is a sectional front view of an acoustic wave device according to a first modification of the first preferred embodiment of the present invention.

FIG. 2 is a sectional front view of an acoustic wave device according to a first modification of the first preferred embodiment.

In the present modification, a difference from the first preferred embodiment is that a first insulating layer 28 is provided between the silicon support substrate 2 and the through-via electrode 11 and between the piezoelectric structure 12 and the through-via electrode 11. Another difference between the present modification and the first preferred embodiment is that a second insulating layer 29 is provided between the silicon support substrate 2 and the second wiring electrode 13. The acoustic wave device of the present modification is similar to the acoustic wave device 1 of the first preferred embodiment excluding the above differences.

As in the first preferred embodiment, the piezoelectric layer 6 does not break easily in the present modification. In addition, since the first insulating layer 28 is provided, a leakage current is further less likely to be generated between the silicon support substrate 2, the piezoelectric structure 12, and the through-via electrode 11. Since the second insulating layer 29 is provided, a leakage current is further less likely to be generated between the silicon support substrate 2 and the second wiring electrode 13. Therefore, the filter characteristics of the acoustic wave device are further less likely to deteriorate.

In the present modification, the first insulating layer 28 and the second insulating layer 29 are preferably integrally made of the same or similar material. An inorganic dielectric material, for example, a silicon oxide or silicon oxynitride, or a suitable resin material may preferably be used as the material of the first insulating layer 28 and the second insulating layer 29. The first insulating layer 28 and the second insulating layer 29 may be provided independently of each other. Alternatively, one of the first insulating layer 28 and the second insulating layer 29 may be provided. Preferably, both the first insulating layer 28 and the second insulating layer 29 are provided, for example.

When viewed in the direction normal or substantially normal to the second main surface 2b of the silicon support substrate 2, the second insulating layer 29 is preferably positioned, for example, farther toward the inner side than the support layer 3. As a result, when the acoustic wave device is provided by cutting with a dicing machine, the second insulating layer 29 will not be cut with the dicing machine. Also when a portion where the support layer 3 is provided is cut with a dicing machine, the second insulating layer 29 will not be cut with the dicing machine. Consequently, the thickness of a portion to be cut with a dicing machine is able to be more reliably reduced, and the time efficiency of dicing is able to be significantly improved. Therefore, the productivity is able to be significantly improved, and in addition, the filter characteristics of the acoustic wave device are less likely to deteriorate.

Figure 3:
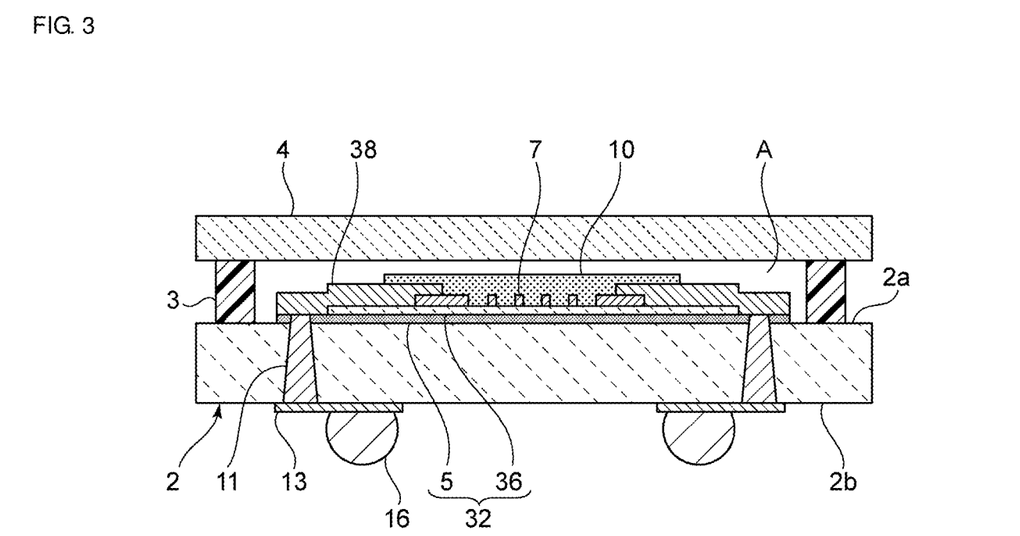
FIG. 3 is a sectional front view of an acoustic wave device according to a second modification of the first preferred embodiment of the present invention.

FIG. 3 is a sectional front view of an acoustic wave device according to a second modification of the first preferred embodiment.

In the second modification, differences from the first preferred embodiment are that the through-via electrode 11 does not extend through a piezoelectric layer 36, which is included in a piezoelectric structure 32, while extending through the low-acoustic-velocity film 5 and that a first wiring electrode 38 is extended to the low-acoustic-velocity film 5. The acoustic wave device of the present modification is similar to the acoustic wave device 1 of the first preferred embodiment excluding the above differences.

The low-acoustic-velocity film 5 includes a portion projecting outward from the piezoelectric layer 36 when viewed in the direction normal or substantially normal to the first main surface 2a of the silicon support substrate 2. The through-via electrode 11 extends through this portion of the low-acoustic-velocity film 5. The first wiring electrode 38 is extended from the piezoelectric layer 36 to this portion of the low-acoustic-velocity film 5 and connected to the through-via electrode 11. The low-acoustic-velocity film 5 has an insulating property as in the first preferred embodiment. Thus, a leakage current is less likely to be generated between the first wiring electrode 38 and the silicon support substrate 2, and the filter characteristics of the acoustic wave device are less likely to deteriorate.

In addition, when the through-via electrode 11 is provided, it is not necessary to provide a through hole in the piezoelectric layer 36, and thus, the piezoelectric layer 36 is further less likely to break.

Figure 4:
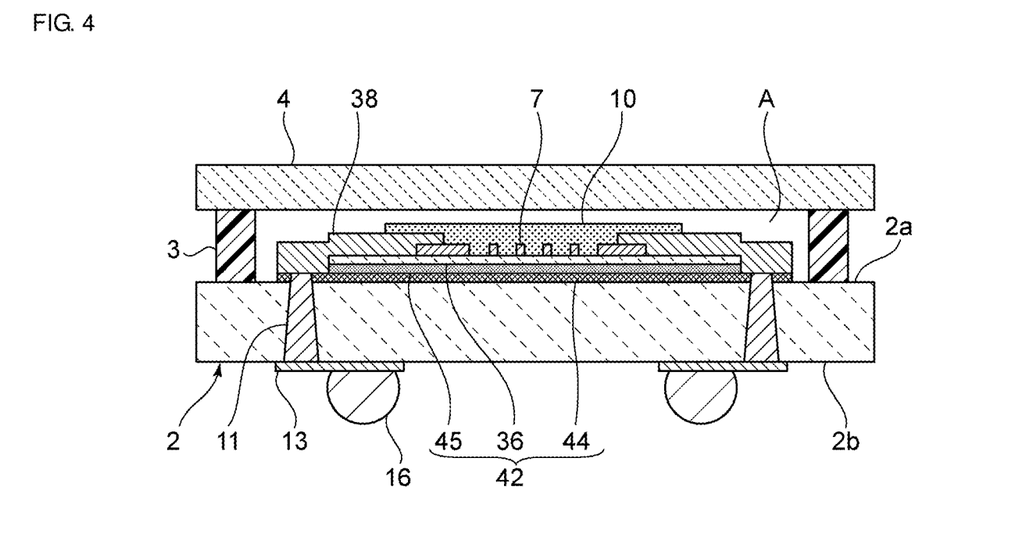
FIG. 4 is a sectional front view of an acoustic wave device according to a second preferred embodiment of the present invention.

FIG. 4 is a sectional front view of an acoustic wave device according to a second preferred embodiment of the present invention.

In the second preferred embodiment, a difference from the first preferred embodiment is that a piezoelectric structure includes a high-acoustic-velocity film 44. The other differences between the second preferred embodiment and the first preferred embodiment are that the through-via electrode 11 does not extend through a low-acoustic-velocity film 45 while extending through the high-acoustic-velocity film 44 and that the first wiring electrode 38 is extended to the high-acoustic-velocity film 44. The acoustic wave device of the second preferred embodiment is similar to the acoustic wave device 1 of the first preferred embodiment excluding the above differences.

For example, the high-acoustic-velocity film 44 includes a piezoelectric layer preferably made of, for example, aluminum nitride, aluminum oxide, silicon carbide, silicon nitride, silicon oxynitride, a DLC film, silicon (Si), sapphire, lithium tantalate, lithium niobate, or quartz crystal or includes one of various ceramics, for example, alumina, zirconia, cordierite, mullite, steatite, and forsterite, diamond, magnesia, a material including at least one of the materials described above as a main component, or a material including a mixture of the materials described above as a main component. The material of the high-acoustic-velocity film 44 has a relatively high acoustic velocity. In the second preferred embodiment, the high-acoustic-velocity film 44 is one of the layers that are included in the piezoelectric structure 42 and each of which has an insulating property.

The high-acoustic-velocity film 44 includes a portion projecting outward from the piezoelectric layer 36 and the low-acoustic-velocity film 45 when viewed in the direction normal or substantially normal to the first main surface 2a of the silicon support substrate 2. The through-via electrode 11 extends through this portion of the high-acoustic-velocity film 44. The first wiring electrode 38 is extended from the piezoelectric layer 36 to the this portion of the high-acoustic-velocity film 44 and connected to the through-via electrode 11. As described above, the high-acoustic-velocity film 44 has an insulating property. Thus, a leakage current is less likely to be generated between the first wiring electrode 38 and the silicon support substrate 2, and the filter characteristics of the acoustic wave device are less likely to deteriorate.

Also in the second preferred embodiment, the acoustic wave device has a structure in which the high-acoustic-velocity film 44, the low-acoustic-velocity film 45, and the piezoelectric layer 36 are laminated together, and thus, energy of an excited acoustic wave is able to be effectively confined to the side of the piezoelectric layer 36.

As in the second modification of the first preferred embodiment, the through-via electrode 11 may extend through the low-acoustic-velocity film 45, and the first wiring electrode 38 may be extended to the low-acoustic-velocity film 45. As in the first preferred embodiment, the through-via electrode 11 may extend through all the layers of the piezoelectric structure 32, and the first wiring electrode 38 is not necessarily extended to the low-acoustic-velocity film 45 or the high-acoustic-velocity film 44.

Figure 5:
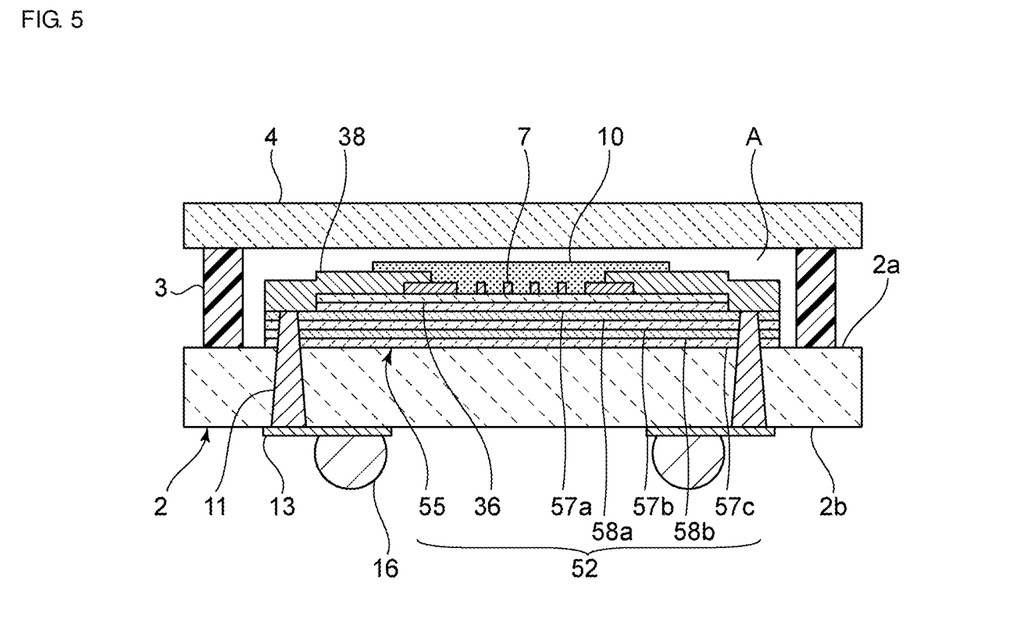
FIG. 5 is a sectional front view of an acoustic wave device according to a third preferred embodiment of the present invention.

FIG. 5 is a sectional front view of an acoustic wave device according to a third preferred embodiment of the present invention.

In the third preferred embodiment, differences from the first preferred embodiment are that a piezoelectric structure 52 does not include the low-acoustic-velocity film 5 while including an acoustic reflection film 55 and that the first wiring electrode is located at a position different from that in the first preferred embodiment. The acoustic wave device of the third preferred embodiment is similar to the acoustic wave device 1 of the first preferred embodiment excluding the above differences.

The acoustic reflection film 55 includes low-acoustic-impedance layers each having a relatively low acoustic impedance and high-acoustic-impedance layers each having a relatively high acoustic impedance. In the third preferred embodiment, the high-acoustic-impedance layers and the low-acoustic-impedance layers are alternately laminated together. More specifically, the acoustic reflection film 55 includes, for example, three low-acoustic-impedance layers, which are a low-acoustic-impedance layer 57a, a low-acoustic-impedance layer 57b, and a low-acoustic-impedance layer 57c. The acoustic reflection film 55 includes, for example, two high-acoustic-impedance layers, which are a high-acoustic-impedance layer 58a and a high-acoustic-impedance layer 58b. In the third preferred embodiment, the layer of the acoustic reflection film 55 that is closest to the piezoelectric layer 36 is the low-acoustic-impedance layer 57a. The number of the low-acoustic-impedance layers and the number of the high-acoustic-impedance layers laminated together in the acoustic reflection film 55 are not limited to the above.

Also in the acoustic wave device that include the above-described acoustic reflection film 55, energy of an acoustic wave is able to be effectively confined to the side of the piezoelectric layer 36.

Here, in the third preferred embodiment, the plurality of low-acoustic-impedance layers and the plurality of high-acoustic-impedance layers are layers that are included in the piezoelectric structure 52 and each of which has an insulating property. When viewed in the direction normal or substantially normal to the first main surface 2a of the silicon support substrate 2, the high-acoustic-impedance layer 58a includes a portion projecting outward from the low-acoustic-impedance layer 57a, which is laminated and closer to the piezoelectric layer 36 than the high-acoustic-impedance layer 58a. The low-acoustic-impedance layer 57b, the high-acoustic-impedance layer 58b, and the low-acoustic-impedance layer 57c each include a portion similar to the above projecting portion.

The through-via electrode 11 extends through the high-acoustic-impedance layer 58a, the low-acoustic-impedance layer 57b, the high-acoustic-impedance layer 58b, the low-acoustic-impedance layer 57c, and the silicon support substrate 2. On the other hand, the through-via electrode 11 does not extend through the piezoelectric layer 36 and the low-acoustic-impedance layer 57a.

The first wiring electrode 38 is extended from the piezoelectric layer 36 to the projecting portion of the high-acoustic-impedance layer 58a and connected to the through-via electrode 11. As described above, the plurality of low-acoustic-impedance layers and the plurality of high-acoustic-impedance layers each have an insulating property.

Thus, a leakage current is less likely to be generated between the first wiring electrode and the silicon support substrate 2, and the filter characteristics of the acoustic wave device are less likely to deteriorate.

Among the plurality of low-acoustic-impedance layers and the plurality of high-acoustic-impedance layers, one of the layers through each of which the through-via electrode 11 extends, the one being closest to the piezoelectric layer 36, is one of the layers of the piezoelectric structure 52 each of which has an insulating property. The first wiring electrode 38 extends to one of the plurality of low-acoustic-impedance layers and the plurality of high-acoustic-impedance layers through each of which the through-via electrode 11 extends, the one being closest to the piezoelectric layer 36. Alternatively, as in the first preferred embodiment, the through-via electrode 11 may extend through all the layers of the piezoelectric structure 52, and the first wiring electrode 38 is not necessarily extended to the acoustic reflection film 55.

Figure 6:
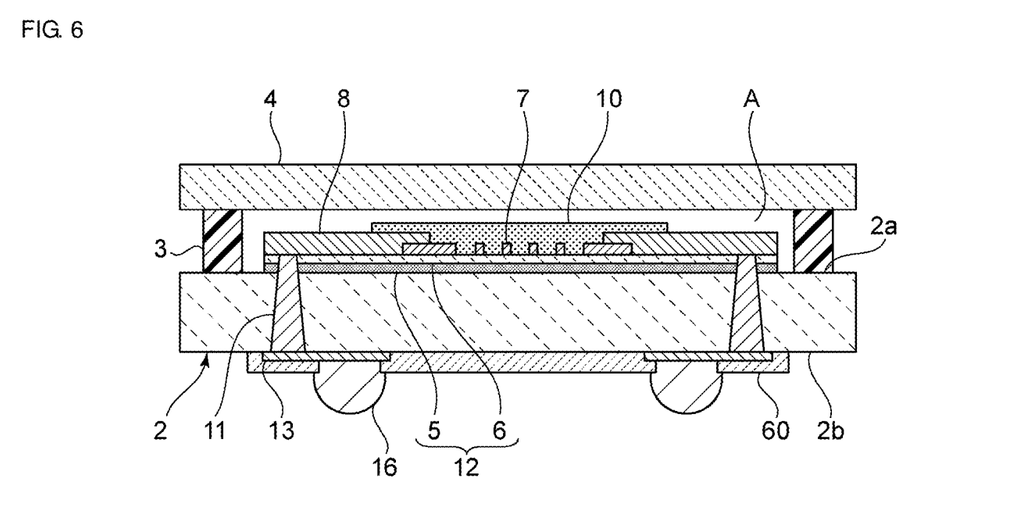
FIG. 6 is a sectional front view of an acoustic wave device according to a fourth preferred embodiment of the present invention.

FIG. 6 is a sectional front view of an acoustic wave device according to a fourth preferred embodiment of the present invention.

In the fourth preferred embodiment, a difference from the first preferred embodiment is that a protective film 60 is provided on the second main surface 2b of the silicon support substrate 2 and covers a portion of the second wiring electrode 13. The acoustic wave device of the fourth preferred embodiment is similar to the acoustic wave device 1 of the first preferred embodiment excluding the above difference. The bump 16 is provided on a portion of the second wiring electrode 13 that is not covered with the protective film 60.

Here, in general, a wiring electrode that is included in an acoustic wave device and that faces the outside of the acoustic wave device is particularly likely to break. In the fourth preferred embodiment, since the protective film 60 is provided, the second wiring electrode 13 does not break easily.

As in the fourth preferred embodiment, when viewed in the direction normal or substantially normal to the second main surface 2b of the silicon support substrate 2, the protective film 60 is preferably positioned, for example, farther toward the inner side than the support layer 3. As a result, when the acoustic wave device is provided by cutting with a dicing machine, the protective film 60 will not be cut with the dicing machine. Also when a portion where the support layer 3 is provided is cut with a dicing machine, the protective film 60 will not be cut with the dicing machine. Consequently, the thickness of a portion to be cut with a dicing machine is able to be more reliably reduced, and the time efficiency of dicing is able to be significantly improved. Therefore, the productivity is able to be significantly improved, and in addition, the second wiring electrode 13 does not break easily.

In addition, also in the fourth preferred embodiment, the first wiring electrode 8 is indirectly provided on the first main surface 2a of the silicon support substrate 2 with the piezoelectric structure 12 interposed therebetween as in the first preferred embodiment. Thus, a leakage current is less likely to be generated between the first wiring electrode 8 and the silicon support substrate 2, and the filter characteristics of the acoustic wave device are less likely to deteriorate.

Each of the acoustic wave devices of the above-described preferred embodiments may be used as, for example, a duplexer of a high-frequency front-end circuit. This case will be described below.

Figure 7:
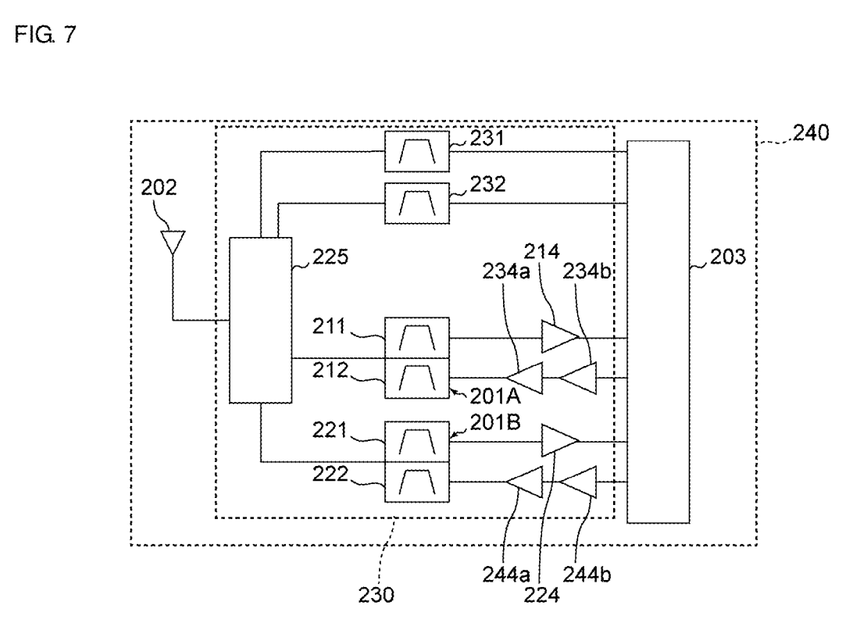
FIG. 7 is a diagram showing a communication device that includes a high-frequency front-end circuit.

FIG. 7 is a diagram showing a communication device and a high-frequency front-end circuit according to a preferred embodiment of the present invention. FIG. 7 also shows components that are connected to a high-frequency front-end circuit 230, which are, for example, an antenna element 202 and an RF signal processing circuit (RFIC) 203. The high-frequency front-end circuit 230 and the RF signal processing circuit 203 are included in a communication device 240. The communication device 240 may include a power supply, a CPU, or a display.

The high-frequency front-end circuit 230 includes a switch 225, duplexers 201A and 201B, filters 231 and 232, low-noise amplifier circuits 214 and 224, and power amplifier circuits 234a, 234b, 244a, and 244b. The high-frequency front-end circuit 230 and the communication device 240, which are shown in FIG. 7, are respectively an example of a high-frequency front-end circuit and an example of a communication device and are not limited to having the above features, elements, and components.

The duplexer 201A includes filters 211 and 212. The duplexer 201B includes filters 221 and 222. The duplexers 201A and 201B are connected to the antenna element 202 via the switch 225. Each of the above-described acoustic wave devices may be one of the duplexers 201A and 201B or may be one of the filters 211, 212, 221, and 222.

In addition, each of the above-described acoustic wave devices is also able to be applied to a multiplexer including three or more filters, for example, a triplexer in which an antenna terminal is shared by three filters or a hexaplexer in which an antenna terminal is shared by six filters.

In other words, the above-described acoustic wave devices include an acoustic wave resonator, a filter, a duplexer, and a multiplexer including three or more filters. The multiplexer is not limited to including both a transmission filter and a reception filter and may include only a transmission filter or only a reception filter.

The switch 225 connects, in accordance with a control signal from a controller (not shown), the antenna element 202 and a signal path that uses a predetermined band to each other and may preferably be, for example, a single-pole, double-throw (SPDT) switch. The number of signal paths to be connected to the antenna element 202 is not limited to one and may be two or more. In other words, the high-frequency front-end circuit 230 may use carrier aggregation.

The low-noise amplifier circuit 214 is a reception amplifier circuit that amplifies a high-frequency signal (here, a high-frequency reception signal) that has passed through the antenna element 202, the switch 225, and the duplexer 201A and outputs the amplified signal to the RF signal processing circuit 203. The low-noise amplifier circuit 224 is a reception amplifier circuit that amplifies a high-frequency signal (here, a high-frequency reception signal) that has passed through the antenna element 202, the switch 225, and the duplexer 201B and outputs the amplified signal to the RF signal processing circuit 203.

The power amplifier circuits 234a and 234b are each a transmission amplifier circuit that amplifies a high-frequency signal (here, a high-frequency transmission signal) that has been output by the RF signal processing circuit 203 and outputs the amplified signal to the antenna element 202 via the duplexer 201A and the switch 225. The power amplifier circuits 244a, and 244b are each a transmission amplifier circuit that amplifies a high-frequency signal (here, a high-frequency transmission signal) that has been output by the RF signal processing circuit 203 and outputs the amplified signal to the antenna element 202 via the duplexer 201B and the switch 225.

The RF signal processing circuit 203 performs signal processing, for example, down conversion on a high-frequency reception signal that has been input thereto from the antenna element 202 via a reception signal path and outputs a reception signal that is generated as a result of the signal processing. In addition, the RF signal processing circuit 203 performs signal processing, for example, up conversion on a transmission signal that has been input thereto and outputs a high-frequency transmission signal that is generated as a result of the signal processing to the power amplifier circuits 234a, 234b, 244a, and 244b. The RF signal processing circuit 203 is, for example, an RFIC. The communication device may include a baseband (BB) IC. Accordingly, the BBIC performs signal processing on a received signal processed by the RFIC. In addition, the BBIC performs signal processing on a transmission signal and outputs the processed transmission signal to the RFIC. A reception signal that has been processed by the BBIC and a transmission signal that has not yet been processed by the BBIC are, for example, an image signal, an audio signal, and so forth.

The high-frequency front-end circuit 230 may include duplexers according to first modifications of duplexers 201A and 201B instead of the duplexers 201A and 201B.

In contrast, filters 231 and 232 in the communication device 240 are connected between the RF signal processing circuit 203 and the switch 225, and the low-noise amplifier circuits 214 and 224 and the power amplifier circuits 234a, 234b, 244a, and 244b are not interposed between the filters 231 and 232 and the RF signal processing circuit 203 and are also not interposed between the filters 231 and 232 and the switch 225. Similar to the duplexers 201A and 201B, the filters 231 and 232 are connected to the antenna element 202 via the switch 225.

According to the high-frequency front-end circuit 230 and the communication device 240, which are provided as described above, by including an acoustic wave resonator, a filter, a duplexer, a multiplexer including three or more filters, and so forth, each of which is the acoustic wave device of the present invention, the piezoelectric layer does not break easily, and the filter characteristics are less likely to deteriorate.

Although the acoustic wave devices, the high-frequency front-end circuits, and the communication devices according to preferred embodiments of the present invention have been described above with respect to the preferred embodiments and their modifications, other preferred embodiments that are obtained by combining arbitrary components of the above-described preferred embodiments and the above-described modifications, the first modification that is provided by applying various modifications devised by those skilled in the art to the above-described preferred embodiments within the gist of the present invention, and various devices that include the high-frequency front-end circuit according to the present invention and the communication device according to the present invention built therein are also included in the scope of the present invention.

The present invention is able to be widely used as an acoustic wave resonator, a filter, a duplexer, a multiplexer that is applicable to a multi-band system, a front-end circuit, and a communication device in communication apparatuses, for example, cellular phones.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An acoustic wave device comprising:
a silicon support substrate that includes a first main surface and a second main surface opposing each other;
a piezoelectric structure that is provided on the first main surface of the silicon support substrate and that includes a piezoelectric layer;
an interdigital transducer (IDT) electrode that is provided on the piezoelectric layer;
a support layer that is provided on the first main surface of the silicon support substrate and surrounds the piezoelectric layer;
a cover layer that is provided on the support layer;
a through-via electrode that extends through the silicon support substrate and the piezoelectric structure; and
a first wiring electrode that is connected to the through-via electrode and is electrically connected to the IDT electrode; wherein
the piezoelectric structure includes at least one layer having an insulating property, the at least one layer including the piezoelectric layer;
the first wiring electrode is provided on the layer having an insulating property;
the piezoelectric structure includes a low-acoustic-velocity film through which a bulk wave propagates at an acoustic velocity lower than an acoustic velocity of a bulk wave that propagates through the piezoelectric layer, and a high-acoustic-velocity film through which an acoustic wave propagates at an acoustic velocity higher than an acoustic velocity of an acoustic wave that propagates through the piezoelectric layer;
the low-acoustic-velocity film is provided between the silicon support substrate and the piezoelectric layer;
the high-acoustic-velocity film is provided between the silicon support substrate and the low-acoustic-velocity film;
the through-via electrode does not extend through the piezoelectric layer and the low-acoustic-velocity film of the piezoelectric structure;
the through-via electrode extends through the high-acoustic-velocity film;
the high-acoustic-velocity film is one of the at least one layer having an insulating property; and
the first wiring electrode is extended from the piezoelectric layer to the high-acoustic-velocity film.

2. The acoustic wave device according to claim 1, wherein
the piezoelectric structure includes an acoustic reflection film including a plurality of the low-acoustic-impedance layer each having a relatively low acoustic impedance and a plurality of the high-acoustic-impedance layer each having a relatively high acoustic impedance; and
the acoustic reflection film is provided between the silicon support substrate and the piezoelectric layer.

3. The acoustic wave device according to claim 2, wherein
the through-via electrode extends through at least one of the plurality of low-acoustic-impedance layers and the plurality of high-acoustic-impedance layers;
one of the plurality of low-acoustic-impedance layers and the plurality of high-acoustic-impedance layers through each of which the through-via electrode extends, the one layer being closest to the piezoelectric layer, is one of the at least one layer having an insulating property; and
the first wiring electrode is extended from the piezoelectric layer to the layer that is one of the plurality of low-acoustic-impedance layers and the plurality of high-acoustic-impedance layers, through each of which the through-via electrode extends, and that is closest to the piezoelectric layer.

4. The acoustic wave device according to claim 1, wherein a first insulating layer is provided between the silicon support substrate and the through-via electrode and between the piezoelectric structure and the through-via electrode.

5. The acoustic wave device according to claim 1, wherein
a second wiring electrode that is connected to the through-via electrode is provided on the second main surface of the silicon support substrate;
a bump is provided on the second wiring electrode; and
when viewed in a direction normal or substantially normal to the second main surface, the bump is provided at a position that does not overlap the through-via electrode.

6. The acoustic wave device according to claim 5, wherein
a protective film is provided on the second main surface of the silicon support substrate and covers a portion of the second wiring electrode;
the bump is provided on a portion of the second wiring electrode that is not covered with the protective film; and
when viewed in the direction normal or substantially normal to the second main surface, the protective film is positioned farther toward an inner side than the support layer.

7. The acoustic wave device according to claim 5, wherein, when viewed in the direction normal or substantially normal to the second main surface, the bump is positioned farther toward the inner side than the through-via electrode.

8. The acoustic wave device according to claim 5, wherein a second insulating layer is provided between the second wiring electrode and the silicon support substrate.

9. The acoustic wave device according to claim 1, wherein, when a wavelength that is defined by a pitch of electrode fingers of the IDT electrode is $\lambda$, a thickness of the piezoelectric layer is about 3.5 $\lambda$ or less.

10. A high-frequency front-end circuit comprising:
the acoustic wave device according to claim 1; and
a power amplifier.

11. A communication device comprising:
the high-frequency front-end circuit according to claim 10; and
an RF signal processing circuit.

12. The acoustic wave device according to claim 1, wherein the piezoelectric structure is provided in a space defined by the silicon support substrate, the support layer, and the cover layer.

13. The acoustic wave device according to claim 1, wherein the least one layer having an insulating property includes an inorganic insulating material.

14. The acoustic wave device according to claim 1, further comprising a dielectric film that covers the IDT electrode.

* * * * *